United States Patent
Liu

(10) Patent No.: US 10,003,348 B2
(45) Date of Patent: Jun. 19, 2018

(54) ANALOG-TO-DIGITAL CONVERTER WITH NOISE SHAPING

(71) Applicant: MEDIATEK INC., Hsin-Chu (TW)

(72) Inventor: Chun-Cheng Liu, Hsin-Chu (TW)

(73) Assignee: MEDIATEK INC., Hsin-Chu (TW)

(*) Notice: Subject to any disclaimer, the term of this patent is extended or adjusted under 35 U.S.C. 154(b) by 0 days. days.

(21) Appl. No.: 15/684,285

(22) Filed: Aug. 23, 2017

(65) Prior Publication Data

US 2018/0069564 A1   Mar. 8, 2018

Related U.S. Application Data

(60) Provisional application No. 62/384,764, filed on Sep. 8, 2016.

(51) Int. Cl.
| | |
|---|---|
| *H03M 1/12* | (2006.01) |
| *H03M 1/08* | (2006.01) |
| *H03M 1/00* | (2006.01) |
| *H03F 3/00* | (2006.01) |
| *H03H 17/02* | (2006.01) |

(52) U.S. Cl.
CPC .............. *H03M 1/08* (2013.01); *H03F 3/005* (2013.01); *H03H 17/0248* (2013.01); *H03M 1/002* (2013.01)

(58) Field of Classification Search
CPC .... H03M 1/08; H03M 1/002; H03H 17/0248; H03F 3/005
USPC .................................................. 341/155, 120
See application file for complete search history.

(56) References Cited

U.S. PATENT DOCUMENTS

| | | | |
|---|---|---|---|
| 5,585,801 A | 12/1996 | Thurston | |
| 6,035,694 A * | 3/2000 | Dupuie | G01P 15/125 73/1.38 |
| 6,211,805 B1 * | 4/2001 | Yu | H03M 1/0668 341/144 |

(Continued)

FOREIGN PATENT DOCUMENTS

CN         105322964 A         2/2016

OTHER PUBLICATIONS

Fredenburg, J., et al.; "A 90MS/s 11MHz Bandwidth 62dB SNDR Noise-Shaping SAR ADC;" IEEE International Solid-State Circuits Conference; Session 27; Data Converter Techniques; 2012; pp. 467-469.

(Continued)

*Primary Examiner* — Brian Young
(74) *Attorney, Agent, or Firm* — McClure, Qualey & Rodack, LLP

(57) ABSTRACT

An analog-to-digital converter (ADC) using an amplifier-based noise shaping circuit. The amplifier-based noise shaping circuit generates a noise shaping signal. A comparator of the ADC has a first input terminal coupled to an output terminal of a capacitive data acquisition converter that captures an analog input, a second input terminal receiving the noise shaping signal, and an output terminal for observation of the digital representation of the analog input. The amplifier-based noise shaping circuit uses an amplifier to amplify a residual voltage obtained from the capacitive data acquisition converter and provides a switched capacitor network between the amplifier and the comparator for sampling the amplified residual voltage and generating the noise shaping signal.

22 Claims, 4 Drawing Sheets

(56) References Cited

U.S. PATENT DOCUMENTS

| | | | | |
|---|---|---|---|---|
| 8,947,285 B2* | 2/2015 | Ceballos | ............... | H03M 3/418 |
| | | | | 341/118 |
| 9,397,692 B1* | 7/2016 | Zanbaghi | .............. | H03M 3/438 |
| 9,722,746 B2* | 8/2017 | Ho | ........................ | H04L 5/0041 |
| 2010/0097256 A1 | 4/2010 | Hurrell et al. | | |

OTHER PUBLICATIONS

Lin, J., et al.; "A 15.5 dB, Wide Signal Swing, Dynamic Amplifier Using a Common-Mode Voltage Detection Technique;" IEEE; 2011; pp. 21-24.

Roy, A., et al.; "A Low-Power Switched-Capacitor Passive Sigma-Delta Modulator;" Oct. 2015; pp. 1-4.

\* cited by examiner

ANALOG-TO-DIGITAL CONVERTER WITH NOISE SHAPING

CROSS REFERENCE TO RELATED APPLICATIONS

This application claims the benefit of U.S. Provisional Application No. 62/384,764, filed Sep. 8, 2016, the entirety of which is incorporated by reference herein.

BACKGROUND OF THE INVENTION

Field of the Invention

The present invention relates to analog-to-digital converters (ADCs).

Description of the Related Art

In electronics, an analog-to-digital converter is a system that converts an analog input into a digital signal.

Noise shaping is a technique typically used in ADCs to increase the apparent signal-to-noise ratio of the resultant signal. The spectral shape of the error introduced by dithering and quantization is altered. The noise power is at a lower level in frequency bands at which noise is considered to be more undesirable.

An additional circuit for noise shaping, however, causes additional power consumption and takes up additional die space.

BRIEF SUMMARY OF THE INVENTION

A small-sized and low-power analog-to-digital converter with noise shaping is introduced.

An analog-to-digital converter with noise shaping in accordance with an exemplary embodiment of the disclosure comprises a comparator and an amplifier-based noise shaping circuit. The comparator has a first input terminal coupled to an output terminal of a capacitive data acquisition converter (C-DAC) that captures an analog input, a second input terminal receiving a noise shaping signal, and an output terminal outputting a digital representation of the analog input. The amplifier-based noise shaping circuit generates the noise shaping signal. The amplifier-based noise shaping circuit uses an amplifier to amplify a residual voltage obtained from the capacitive data acquisition converter and provides a switched capacitor network between the amplifier and the comparator for sampling the amplified residual voltage and generating the noise shaping signal. Because of the amplifier, it is feasible to use small capacitors in the switched capacitor network and the input referred noise (e.g. the KT/C noise) is effectively suppressed.

In an exemplary embodiment, the amplifier is a dynamic amplifier which is silent on static current. Thus, the power consumption is effectively reduced.

In another exemplary embodiment, an analog-to-digital converter obtains a digital representation of an analog input via a successive approximation through all possible quantization levels is introduced, which comprises a comparator, a weighted capacitor array, an amplifier-based noise shaping circuit and a successive approximation logic. The weighted capacitor array is coupled to a first positive input terminal of the comparator. The amplifier-based noise shaping circuit is coupled to a second positive input terminal of the comparator. The successive approximation logic switches capacitors within the weighted capacitor array in accordance with an output signal of the comparator for successive approximation of the analog input of the analog-to-digital converter. Digital representation of the analog input is obtained by the successive approximation logic. The amplifier-based noise shaping circuit provides the comparator with a noise shaping signal via the second positive input terminal of the comparator. The amplifier-based noise shaping circuit uses an amplifier to amplify a residual voltage obtained from the weighted capacitor array which shows the electric charges that remain in the capacitors of the weighted capacitor array. The amplifier-based noise shaping circuit provides a switched capacitor network between the amplifier and the comparator. In an exemplary embodiment, the amplifier is a dynamic amplifier which is silent on static current.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
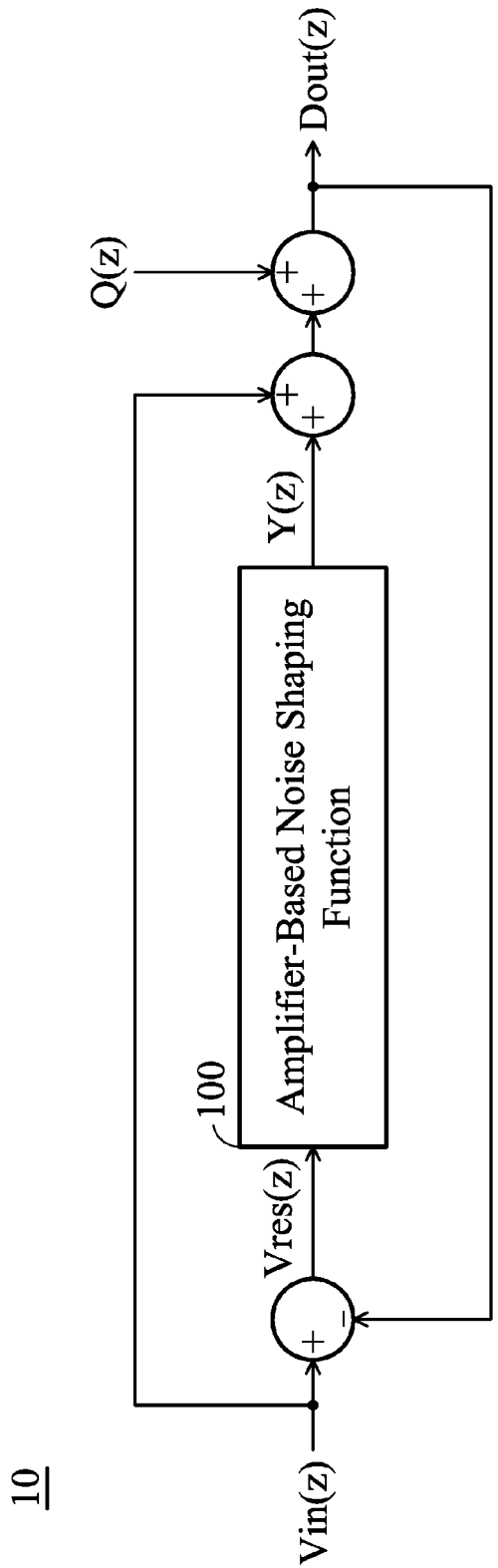
FIG. 1 shows a functional representation of an analog-to-digital converter 10 with noise shaping in accordance with an exemplary embodiment of the disclosure.

FIG. 1 shows a functional representation of an analog-to-digital converter 10 with noise shaping in accordance with an exemplary embodiment of the disclosure. The analog-to-digital converter 10 includes an amplifier-based noise shaping function 100. A digitized residual voltage Vres(z) representing the difference between the digitized analog input Vin(z) and the digital output Dout(z) is transformed to a noise shaping signal Y(z) by the amplifier-based noise shaping function 100. In addition to the digitized analog input Vin(z) and a quantization error Q(z), the noise shaping signal Y(z) is also introduced in generating of the digital output Dout(z) to attenuate the noise in the entire analog-to-digital conversion. The amplifier-based noise shaping function 100 amplifies the digitized residual voltage Vres(z) before performing filtering procedures on the amplified digitized residual voltage Vres(z). Because of the advanced amplification, it is feasible to use small capacitors in the following filter circuit and the input referred noise (e.g. the KT/C noise) is effectively suppressed. For example, when a gain of the advanced amplification is A, the capacitor size in the following filter circuit is shrunk by A and the input referred noise (e.g. the KT/C noise) is suppressed by a square root of A in comparison with conventional techniques without the advanced amplification.

Figure 2A:
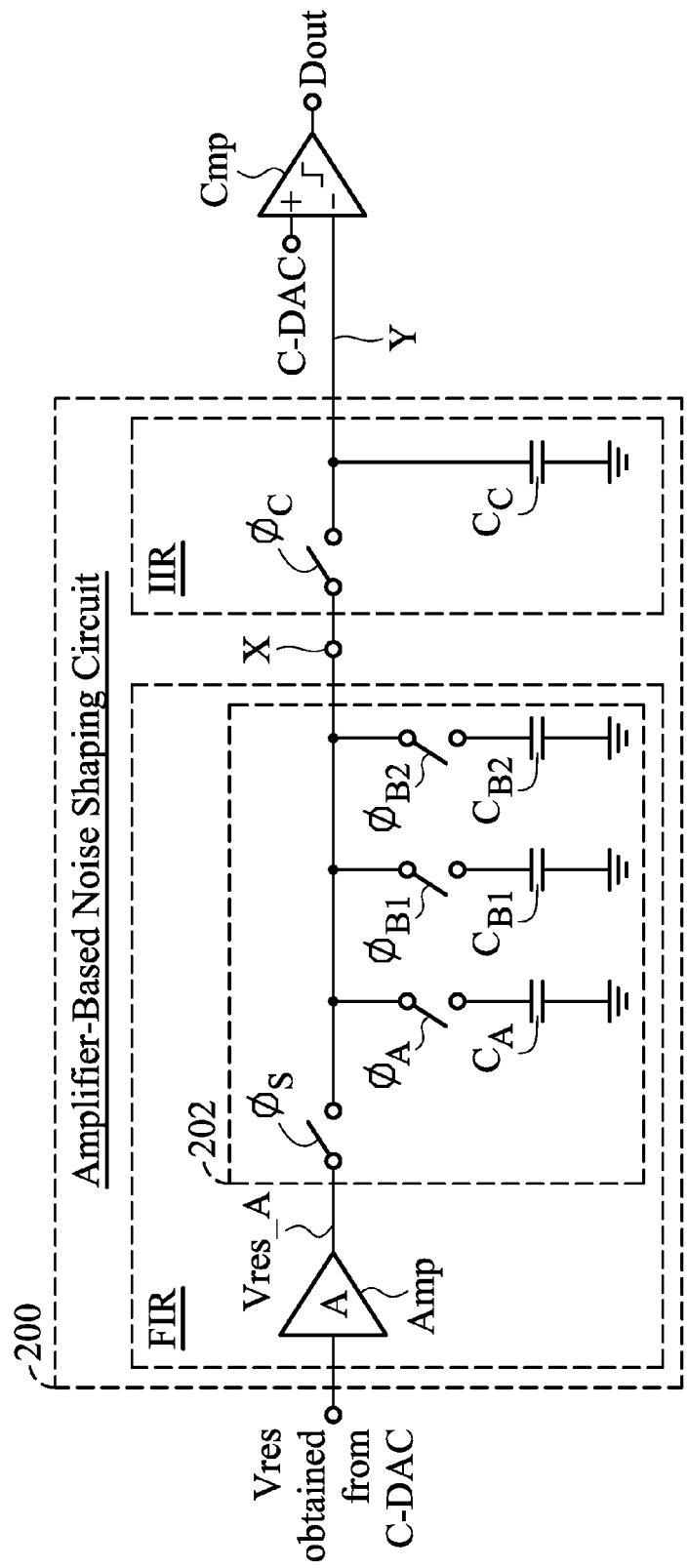
FIG. 2A is a circuit diagram, which shows an amplifier-based noise shaping circuit 200 and a comparator cmp of the analog-to-digital converter in accordance with an exemplary embodiment of the disclosure.

FIG. 2A is a circuit diagram, which shows an amplifier-based noise shaping circuit 200 and a comparator cmp of the analog-to-digital converter 10 as referred to in FIG. 1 in accordance with an exemplary embodiment of the disclosure.

The amplifier-based noise shaping circuit 200 provides the amplifier-based noise shaping function 100. The comparator cmp has a first input terminal coupled to an output terminal of a capacitive data acquisition converter (C-DAC) that captures an analog input for analog-to-digital conversion, a second input terminal receiving a noise shaping signal Y generated by the amplifier-based noise shaping circuit 200, and an output terminal for observation of the digital representation Dout of the analog input. The amplifier-based noise shaping circuit 200 uses an amplifier Amp to amplify a residual voltage Vres obtained from the capacitive data acquisition converter (C-DAC) and provides a switched capacitor network 202 between the amplifier Amp and the comparator cmp.

The amplifier Amp may be a dynamic amplifier which is silent on static current. Because unnecessary static current is removed, the power dissipation is effectively reduced.

Referring back to FIG. 2A, the amplifier-based noise shaping circuit 200 comprises a finite impulse response filter FIR and an infinite impulse response filter IIR. The finite impulse response filter FIR comprises the amplifier Amp and the switched capacitor network 202. The finite impulse response filter FIR successfully attenuates the quantization noise and the comparator noise of the entire analog-to-digital conversion. Small-sized capacitors can be used in the switched capacitor network 202 because of the advanced amplification provided by the amplifier Amp. The infinite impulse response filter IIR is cascaded between the finite impulse response filter FIR and the comparator cmp. The infinite impulse response filter IIR is used for improving the resolution gain of the entire analog-to-digital conversion and can be optional. In other exemplary embodiments, the infinite impulse response filter IIR can be an integrator. As for the example shown in FIG. 2A, benefiting from the amplifier Amp and the small-sized capacitors in the switched capacitor network 202, the infinite impulse response filter IIR is implemented by using a passive charge sharing circuit instead of an integrator that requires an operational amplifier. Power consumption is considerably reduced.

As shown in FIG. 2A, the switched capacitor network 202 is detailed. A sampling switch $\phi_S$ is provided for sampling an amplified residual voltage Vres_A retrieved from the amplifier Amp. The sampling switch $\phi_S$ has a first terminal coupled to the amplifier Amp and a second terminal. Capacitors $C_A$, $C_{B1}$ and $C_{B2}$ are coupled to the second terminal of the sampling switch $\phi_S$ via switches $\phi_A$, $\phi_{B1}$ and $\phi_{B2}$, respectively. The switches $\phi_A$, $\phi_{B1}$ and $\phi_{B2}$ further respectively couple the capacitors $C_A$, $C_{B1}$ and $C_{B2}$ to an output terminal X of the switched capacitor network 202. By controlling the sampling switch $\phi_S$ and the switches $\phi_A$, $\phi_{B1}$ and $\phi_{B2}$, the finite impulse response filter FIR attenuates the quantization noise and the comparator noise of the entire analog-to-digital conversion.

The infinite impulse response filter IIR shown in FIG. 2A is detailed in this paragraph, which comprises a switch $\psi C$ and a capacitor CC. The output terminal X of the switched capacitor network 202 is coupled to a first terminal of the capacitor CC via the switch $\psi C$. The first terminal of the capacitor CC is further coupled to the second input terminal of the comparator cmp. By controlling the switch $\psi C$, the capacitor CC provides the comparator cmp with the noise shaping signal Y. The pure passive design is feasible in the infinite impulse response filter IIR shown in FIG. 2A because the capacitance of the capacitors CA, CB1 and CB2 is small enough.

Figure 2B:
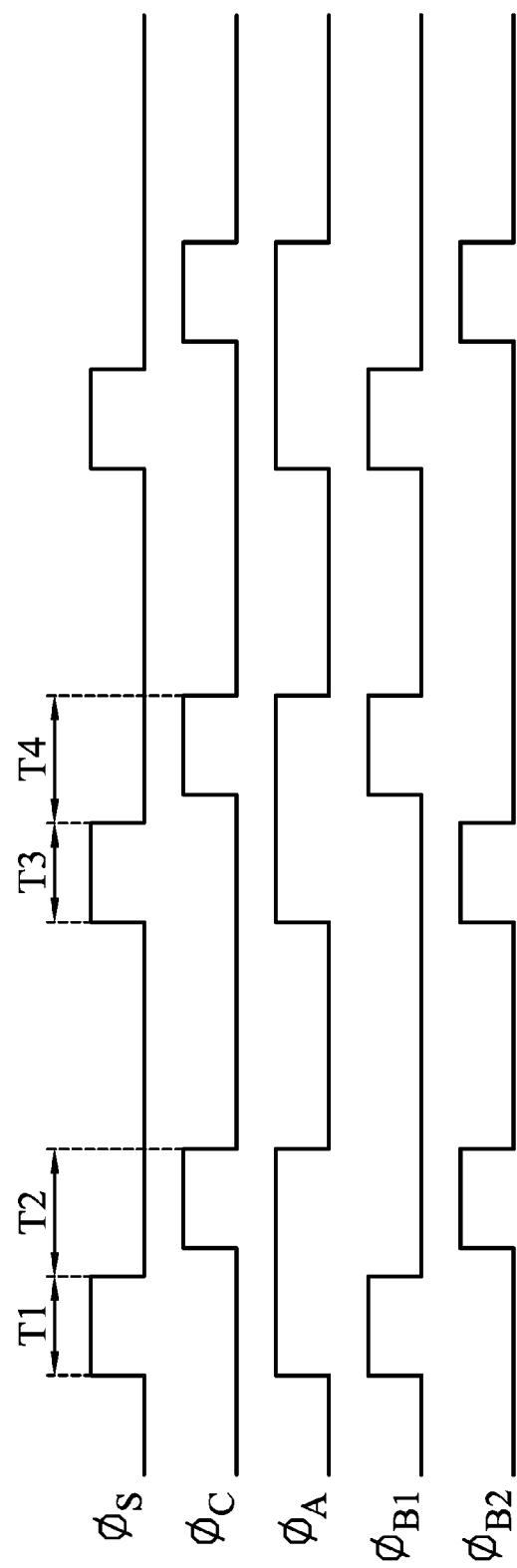
FIG. 2B shows waveforms depicting operations of the sampling switch $\phi_S$ and the switches $\phi_A$, $\phi_{B1}$, $\phi_{B2}$ and $\phi_C$.

FIG. 2B shows waveforms depicting operations of the sampling switch $\phi_S$ and the switches $\phi_A$, $\phi_{B1}$, $\phi_{B2}$ and $\phi_C$. For simplicity, four time intervals T1 to T4 are discussed in this paragraph. The operations of the sampling switch $\phi_S$ and the switches $\phi_A$, $\phi_{B1}$, $\phi_{B2}$ and $\phi_C$ can be repeated periodically. The sampling switch $\phi_S$ is turned on during time intervals T1 and T3 to sample the amplified residual voltage Vres_A. The switch $\phi_C$ is turned on during time intervals T2 and T4 to pass the output X of the switched capacitor network 202 to the capacitor $C_C$ of the infinite impulse response filter IR. The switch $\phi_A$ is turned on during the time intervals T1, T2, T3 and T4. The switches $\phi_{B1}$ and $\phi_{B2}$ are turned on in an interleaving way. The switch $\phi_{B1}$ is turned on during time intervals T1 and T4 and the switch $\phi_{B2}$ is turned on during time intervals T2 and T3. The generated noise-shaping signal Y(z) is:

$$Y(z) = A\left[\frac{C_A Z^{-1} + C_B Z^{-2}}{C_A + C_B + C_C}\right]\frac{1}{1 - K_A Z^{-1}}V_{res}(z), K_A = \frac{C_C}{C_A + C_B + C_C}$$

where $C_{B1}=C_{B2}=C_B$. The capacitor $C_A$ is designed for the delay operator $Z^{-1}$ and the capacitors $C_{B1}$ and $C_{B2}$ are designed for the delay operator $Z^{-2}$. In an exemplary embodiment, the sum of the capacitance of the capacitors $C_{B1}$ and $C_{B2}$ is negligible in comparison with the capacitance of the capacitor $C_C$. Thus, the factor $K_A$ approaches the desired value 1.

In some exemplary embodiments, the analog-to-digital converter 10 with noise shaping is implemented as a charge-redistribution successive approximation analog-to-digital converter. The capacitive data acquisition converter (C-DAC) comprises a weighted capacitor array for successive approximation of the analog input of the ADC. The residual voltage Vres is obtained from the weighted capacitor array which shows the electric charges that remain in capacitors of the weighted capacitor array.

Figure 3:
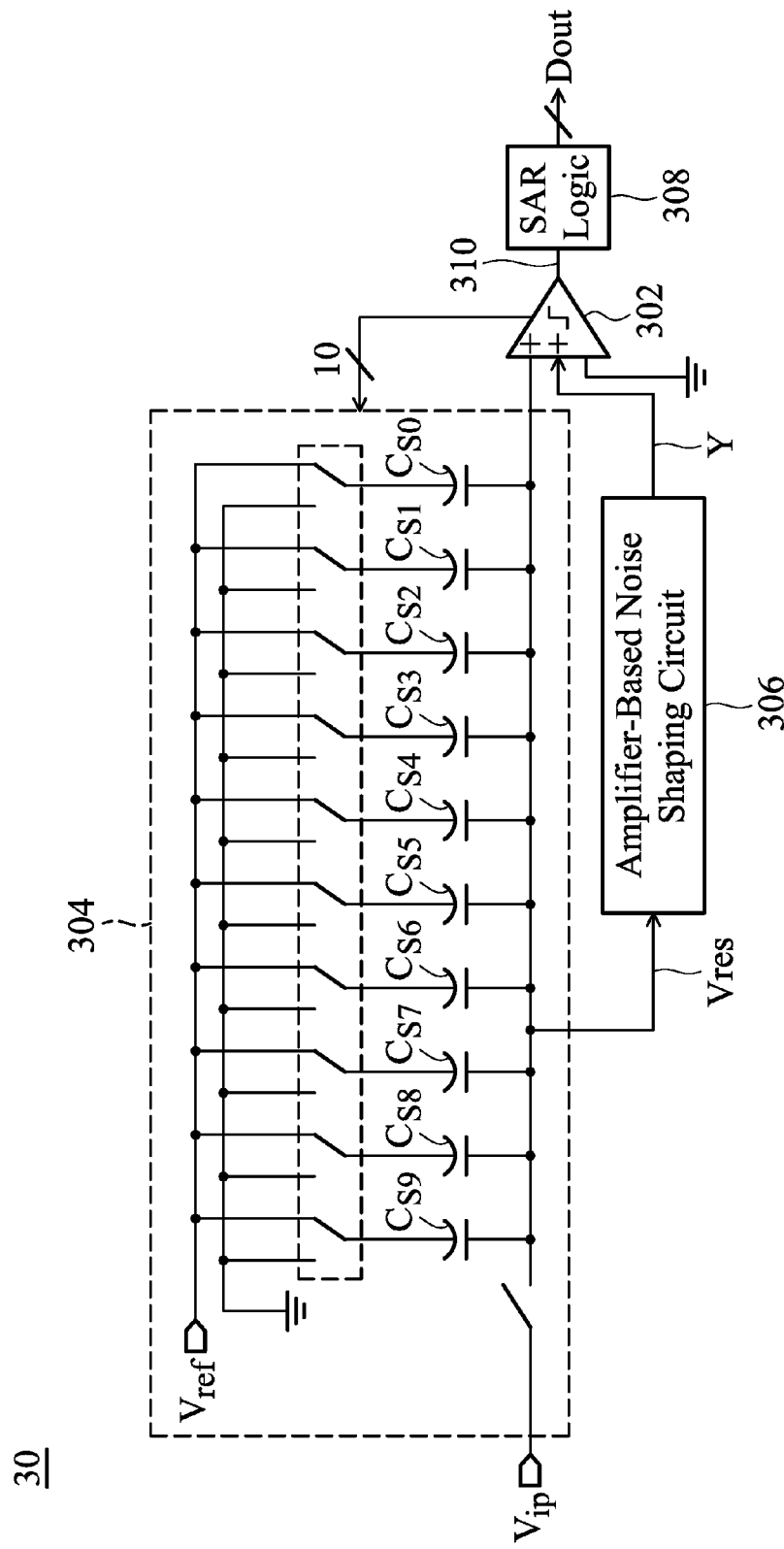
FIG. 3 shows a charge-redistribution successive approximation analog-to-digital converter 30 in accordance with an exemplary embodiment of the disclosure, which comprises a comparator 302, a weighted capacitor array 304, an amplifier-based noise shaping circuit 306 and a successive approximation logic 308.

FIG. 3 shows a charge-redistribution successive approximation analog-to-digital converter 30 in accordance with an exemplary embodiment of the disclosure, which comprises a comparator 302, a weighted capacitor array 304, an amplifier-based noise shaping circuit 306 and a successive approximation logic 308. The weighted capacitor array 304 is coupled to a first positive input terminal '+' of the comparator 302. The amplifier-based noise shaping circuit 306 is coupled to a second positive input terminal '+' of the comparator 302. The successive approximation logic 308 switches capacitors $C_{S0}$ to $C_{S9}$ within the weighted capacitor array 304 in accordance with an output signal 310 of the comparator 302 for successive approximation of an analog input (Vin, a differential signal with a positive part Vip shown in FIG. 3) of the analog-to-digital converter 30. Digital representation Dout of the analog input (Vin) is obtained by the successive approximation logic 308. The amplifier-based noise shaping circuit 306 provides the comparator 302 with a noise shaping signal Y via the second positive input terminal '+' of the comparator 302. The amplifier-based noise shaping circuit 306 uses an amplifier (referring to Amp of FIG. 2A) to amplify a residual voltage Vres obtained from the weighted capacitor array 304. The residual voltage Vres shows the electric charges that remain in the capacitors $C_{S0}$ to $C_{S9}$ of the weighted capacitor array 304. The amplifier-based noise shaping circuit 306 provides a switched capacitor network (referring to 202 of FIG. 2A) between the amplifier Amp and the comparator 302. In an exemplary embodiment wherein the amplifier within the amplifier-based noise shaping circuit 306 is a dynamic amplifier silent on static current, the entire charge-redistribution successive approximation analog-to-digital converter 30 that uses passive components is silent on static current. The charge-redistribution successive approximation analog-to-digital converter 30 consumes little power, successfully attenuates noise signals, and has a small size. The amplifier-based noise shaping circuit 306 may be embodied by the aforementioned exemplary embodiments.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter with noise shaping, comprising:
   a comparator, having a first input terminal coupled to an output terminal of a capacitive data acquisition converter that captures an analog input and a second input terminal receiving a noise shaping signal, and outputting a digital representation of the analog input at an output terminal; and
   an amplifier-based noise shaping circuit, generating the noise shaping signal, comprising:
   an amplifier, for amplifying a residual voltage obtained from the capacitive data acquisition converter, wherein the amplifier is a dynamic amplifier which is silent on static current; and
   a switched capacitor network, coupled between the amplifier and the comparator, for sampling the amplified residual voltage and generating the noise shaping signal.

2. The analog-to-digital converter with noise shaping as claimed in claim 1, wherein:
   the amplifier-based noise shaping circuit further comprises a finite impulse response filter comprising the amplifier and the switched capacitor network.

3. The analog-to-digital converter with noise shaping as claimed in claim 2 wherein:
   the amplifier-based noise shaping circuit further comprises an infinite impulse response filter cascaded between the finite impulse response filter and the comparator.

4. The analog-to-digital converter with noise shaping as claimed in claim 3 wherein:
   the infinite impulse response filter is a passive charge sharing circuit.

5. The analog-to-digital converter with noise shaping as claimed in claim 1, wherein the switched capacitor network comprises:
   a sampling switch for sampling the amplified residual voltage provided by the amplifier, wherein the sampling switch has a first terminal coupled to the amplifier and a second terminal;
   a first switch and a first capacitor coupled to the second terminal of the sampling switch via the first switch;
   a second switch and a second capacitor coupled to the second terminal of the sampling switch via the second switch;
   a third switch and a third capacitor coupled to the second terminal of the sampling switch via the third switch; and
   an output terminal, coupled to the first capacitor, the second capacitor and the third capacitor via the first switch, the second switch and the third switch, respectively.

6. The analog-to-digital converter with noise shaping as claimed in claim 5, wherein:
   the sampling switch is turned on during a first time interval;
   the first switch is turned on during the first time interval and also turned on during a second time interval later than the first time interval;
   the second switch is turned on during the first time interval; and
   the third switch is turned on during the second time interval.

7. The analog-to-digital converter with noise shaping as claimed in claim 6, wherein:
   the sampling switch is further turned on during a third time interval later than the second time interval;
   the first switch is further turned on during the third time interval and also turned on during a fourth time interval later than the third time interval;
   the second switch is further turned on during the fourth time interval; and
   the third switch is further turned on during the third time interval.

8. The analog-to-digital converter with noise shaping as claimed in claim 7, further comprising:
   a fourth switch and a fourth capacitor,
   wherein the output terminal of the switched capacitor network is coupled to a first terminal of the fourth capacitor via the fourth switch and the first terminal of the fourth capacitor is coupled to the second input terminal of the comparator.

9. The analog-to-digital converter with noise shaping as claimed in claim 8, wherein:
   the fourth switch is turned on during the second time interval and also turned on during the fourth time interval.

10. The analog-to-digital converter with noise shaping as claimed in claim 9, wherein:
    a sum of capacitance of the second capacitor and the third capacitor is negligible in comparison with the capacitance of the fourth capacitor.

11. The analog-to-digital converter with noise shaping as claimed in claim 1, wherein:
    the capacitive data acquisition converter comprises a weighted capacitor array for successive approximation of the analog input; and
    the residual voltage is obtained from the weighted capacitor array which shows the electric charges that remain in capacitors of the weighted capacitor array.

12. An analog-to-digital converter with noise shaping, comprising:
    a comparator;
    a weighted capacitor array, coupled to a first positive input terminal of the comparator;
    an amplifier-based noise shaping circuit, coupled to a second positive input terminal of the comparator; and a successive approximation logic, which switches capacitors within the weighted capacitor array in accordance with an output signal of the comparator for successive approximation of an analog input of the analog-to-digital converter, wherein:

digital representation of the analog input is obtained by the successive approximation logic;

the amplifier-based noise shaping circuit provides the comparator with a noise shaping signal via the second positive input terminal of the comparator;

the amplifier-based noise shaping circuit uses an amplifier to amplify a residual voltage obtained from the weighted capacitor array which shows the electric charges that remain in the capacitors of the weighted capacitor array; and the amplifier-based noise shaping circuit provides a switched capacitor network between the amplifier and the comparator.

13. The analog-to-digital converter with noise shaping as claimed in claim 12, wherein:

the amplifier is a dynamic amplifier which is silent on static current.

14. The analog-to-digital converter with noise shaping as claimed in claim 13, wherein:

the amplifier-based noise shaping circuit further comprises a finite impulse response filter comprising the amplifier and the switched capacitor network.

15. The analog-to-digital converter with noise shaping as claimed in claim 14 wherein:

the amplifier-based noise shaping circuit further comprises an infinite impulse response filter cascaded between the finite impulse response filter and the comparator.

16. The analog-to-digital converter with noise shaping as claimed in claim 15 wherein:

the infinite impulse response filter is a passive charge sharing circuit.

17. The analog-to-digital converter with noise shaping as claimed in claim 13, wherein the switched capacitor network comprises:

a sampling switch for sampling an amplified residual voltage provided by the amplifier, wherein the sampling switch has a first terminal coupled to the amplifier and a second terminal;

a first switch and a first capacitor coupled to the second terminal of the sampling switch via the first switch;

a second switch and a second capacitor coupled to the second terminal of the sampling switch via the second switch;

a third switch and a third capacitor coupled to the second terminal of the sampling switch via the third switch; and an output terminal, coupled to the first capacitor, the second capacitor and the third capacitor via the first switch, the second switch and the third switch, respectively.

18. The analog-to-digital converter with noise shaping as claimed in claim 17, wherein:

the sampling switch is turned on during a first time interval;

the first switch is turned on during the first time interval and also turned on during a second time interval later than the first time interval;

the second switch is turned on during the first time interval; and the third switch is turned on during the second time interval.

19. The analog-to-digital converter with noise shaping as claimed in claim 18, wherein:

the sampling switch is further turned on during a third time interval later than the second time interval;

the first switch is further turned on during the third time interval and also turned on during a fourth time interval later than the third time interval;

the second switch is further turned on during the fourth time interval; and the third switch is further turned on during the third time interval.

20. The analog-to-digital converter with noise shaping as claimed in claim 19, further comprising:

a fourth switch and a fourth capacitor, wherein the output terminal of the switched capacitor network is coupled to a first terminal of the fourth capacitor via the fourth switch and the first terminal of the fourth capacitor is coupled to the second input terminal of the comparator.

21. The analog-to-digital converter with noise shaping as claimed in claim 20, wherein:

the fourth switch is turned on during the second time interval and also turned on during the fourth time interval.

22. The analog-to-digital converter with noise shaping as claimed in claim 21, wherein:

a sum of capacitance of the second capacitor and the third capacitor is ignorable in comparison with the capacitance of the fourth capacitor.

* * * * *